United States Patent [19]

Allen et al.

[11] Patent Number: 5,244,555
[45] Date of Patent: Sep. 14, 1993

[54] FLOATING POCKET MEMORY DISK CARRIER, MEMORY DISK AND METHOD

[75] Inventors: Ronald Allen; Sum H. Nguyen, both of San Jose; Kan F. Ng, Orinda, all of Calif.

[73] Assignee: Komag, Inc., Milpitas, Calif.

[21] Appl. No.: 799,492

[22] Filed: Nov. 27, 1991

[51] Int. Cl.[5] .......................................... C23C 14/34
[52] U.S. Cl. ............................ 204/192.2; 204/298.15; 118/502; 118/503
[58] Field of Search ..................... 204/192.12, 298.23, 204/298.15, 298.26, 192.2; 156/345; 118/500, 502, 503

[56] References Cited

U.S. PATENT DOCUMENTS

| | | | |
|---|---|---|---|
| 4,473,455 | 9/1984 | Dean et al. | 156/345 X |
| 4,558,388 | 12/1985 | Graves, Jr. | 204/298.25 X |
| 4,589,369 | 5/1986 | Mahler | 118/500 |
| 4,595,481 | 6/1986 | Allen et al. | 204/298 |
| 4,634,512 | 1/1987 | Allen et al. | 204/298 |
| 4,735,701 | 4/1988 | Allen et al. | 204/298 |
| 4,790,921 | 12/1988 | Bloomquist et al. | 118/500 X |
| 4,880,518 | 11/1989 | Akagawa et al. | 204/298.15 |
| 4,932,358 | 6/1990 | Studley et al. | 118/500 X |
| 5,089,110 | 2/1992 | Allen et al. | 204/298.15 |

FOREIGN PATENT DOCUMENTS

2156861A 10/1986 United Kingdom .

Primary Examiner—Nam X. Nguyen
Attorney, Agent, or Firm—Skjerven, Morrill, MacPherson, Franklin & Friel

[57] ABSTRACT

A carrier plate (15) has essentially circular openings (11) for receipt of smaller diameter circular magnetic memory disks (20). Each disk has a plugged aperture, a planar annular band (23) on each side for receiving magnetic media (8), an outer peripheral edge (24) and a chamfer (22) therebetween. An integral stump segment (30) and a pair of integral U-shape channel retainers (40) extend from plate opening (11) to a position overlapping disk chamfer (22) to prevent a disk resting vertically on the stump segment (30) from falling out of the plate (15). Vertical holding walls (40) extend integrally and downwardly from a rear leg of the channel to insure vertical orientation of the disk (20) and stop walls (50) extend integrally and upwardly from that rear leg to prevent overtilting of the disk during its insertion into the plate (15). Gaps (31, 32, 33) are provided between the disk peripheral edge (24) and the opening (11) over about 248° allowing magnetic media to effectively coat the entire annular band surfaces (23).

26 Claims, 6 Drawing Sheets

FLOATING POCKET MEMORY DISK CARRIER, MEMORY DISK AND METHOD

RELATED APPLICATION

This application relates to U.S. Ser. No. 07/559,357 filed Jul. 30, 1990, now U.S. Pat. No. 5,089,110 entitled "Data Storage Disk and Plug"—Allen et al., the disclosure of which is incorporated herein by reference.

FIELD OF INVENTION

The present invention relates to a holder/carrier for read/write data memory disks and a method for loading the disks, sputtering magnetic media on a multiplicity of read/write disks and unloading the disks. More particularly, the invention is directed to a holder/carrier which increases the read/write capability of the finished disks at their outside diameter and to simplify and improve robotic substrate loading while essentially preventing disk magnetic surface imperfections.

BACKGROUND OF THE INVENTION

Disks for use in computer memory storage devices have been manufactured for some years by utilizing a process for sputtering magnetic media on various diameters and thicknesses of aluminum, glass and ceramic disks. As part of the developmental process, groups of disks have been held in a holder/carrier to permit magnetic material to be simultaneously sputtered on the opposed planar surfaces of each disk without any cross-contamination of magnetic material from one side of the disk(s) to the other side of the disk(s). U.S. Pat. No. 4,595,481 issued to the Assignee of this application describes such a carrier where chamfered edges of the disk are supported by a V-groove arc at a bottom of a plate bore through the carrier plate and rests on an arc edge of an upper recess formed above the plate bore. The carrier of U.S. Pat. No. 4,589,369 has a similar upper ridge but includes a square U-shaped groove at the bottom of the bore into which a relatively wide outer annulus of the disk interfits, including a part of the planar disk surface. U.S. Pat. No. 4,634,512 shows and claims an improvement to the −481 patent where two-part plug portions preferably with magnetic surfaces and grasp knobs are employed to close the central aperture of the disks. The central aperture in disk use is utilized to mount the finished disks on a computer disk drive spindle. The plug also aids in robotically mounting the disk(s) in the carrier, to remove the disks from the carrier and to move the disk blanks and finished disks from and to a suitable shipping or storage cassette. U.S. Pat. No. 4,735,701 describes a one-piece plug for closing the disk central aperture.

It has become more important to store more and more data on a disk and to decrease the space between data tracks on the operating planar surfaces of a disk. Such spaces are typically in the range of 0.010 inch to 0.080 inch (0.25 mm to 2.03 mm) so as to prevent crosstalk between the tracks. Likewise, it has been determined that one should try to maximize the usability and thus storage capacity at the outer diameter of each disk. Since a read-write head of a typical disk drive reads signal amplitude, that signal tends to drop off at the outside diameter (O.D.) of the disk at the outer track(s) due to the absence of a normal magnetic layer at that disk O.D. The signal strength is normally a function of the disk radius. For example, disk manufacturers are ask to guarantee data recovery out to about 1.80 inches (45.7 mm) from the disk center in a 5¼ inch (130 mm) disk. In typical present day disks of that size, the disk signal actually "decreases" at about 1.81 inch (46.0 mm) from the disk center. Since data storage is at a circular maximum at the disk O.D. even the addition of 0.05 inches (1.25 mm) of added O.D. band width which will support usable magnetic media would appreciably increase the data storage capacity of the disk. Comparable improvements would be possible with 48 mm, 65 mm and 95 mm and other sizes of magnetic storage disks.

Figure 11:
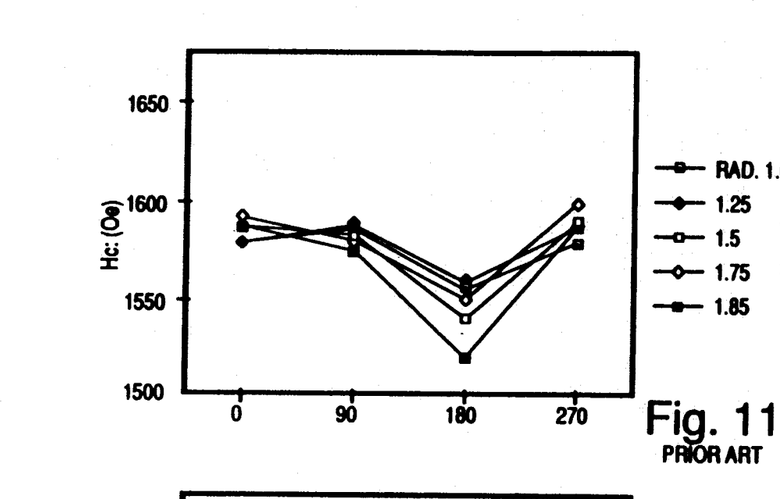
FIG. 11 is a graph of test results on the top surface of a disk manufactured using a prior art carrier.
Figure 12:
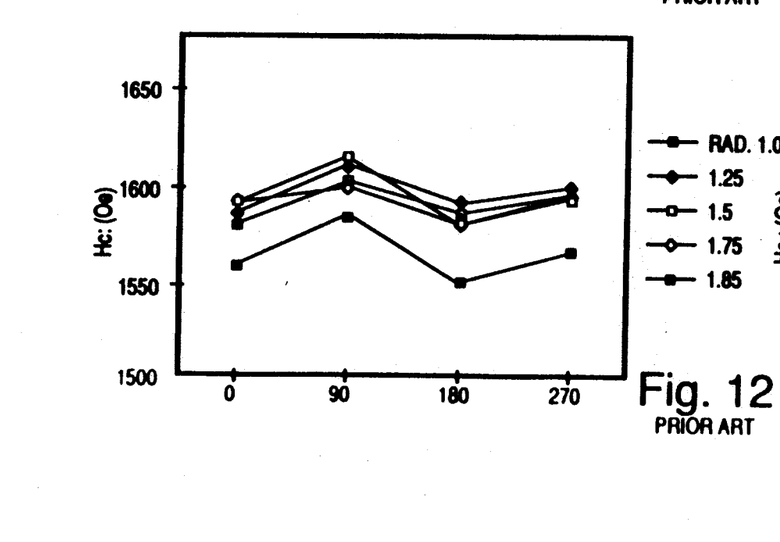
FIG. 12 is a graph of test results on the bottom surface of the FIG. 11 disk.
Figure 13:
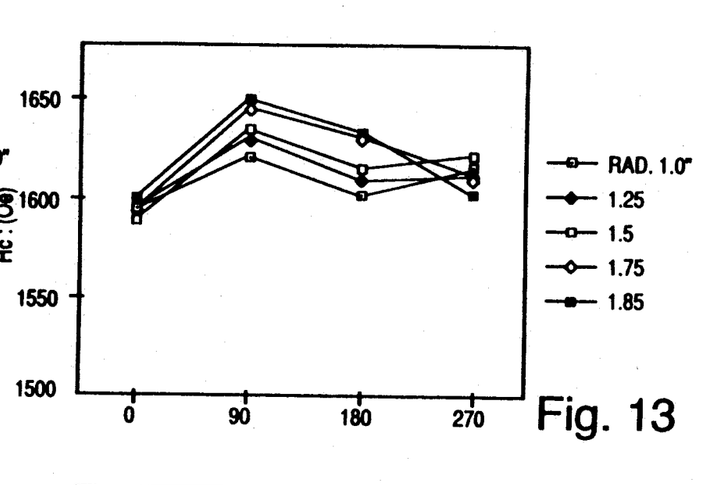
FIG. 13 is a graph of test results on the top surface of a disk manufactured using the carrier of the present invention.
Figure 14:
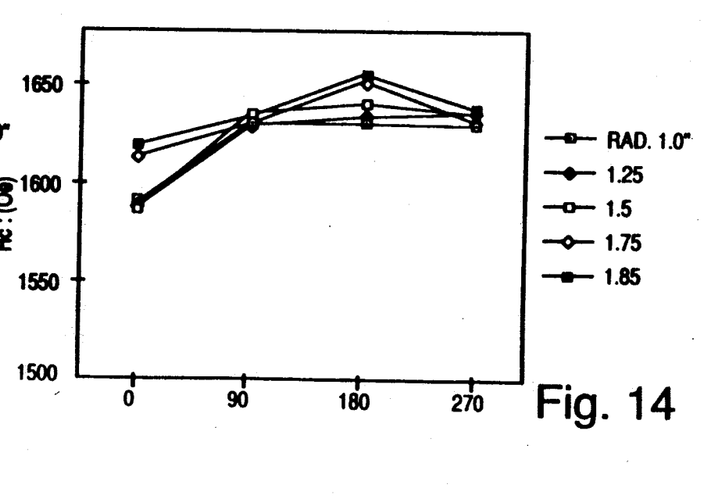
FIG. 14 is a graph of test results on the bottom surface of the FIG. 13 disk.
Figure 15:
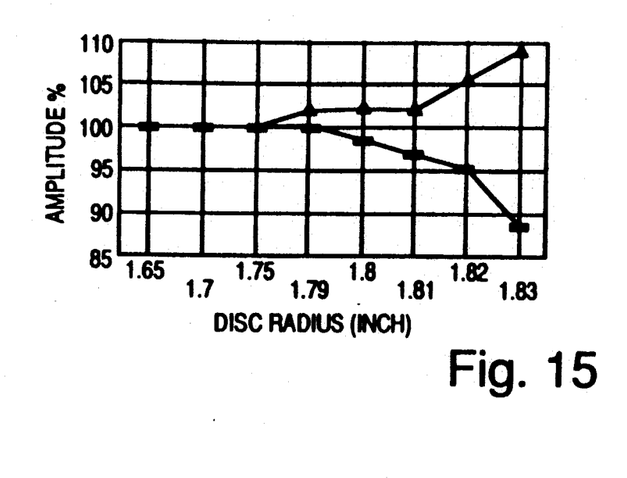
FIG. 15 is a graphical comparison of the top surface, of a prior art disk and finger-retained disk of the invention at line frequency.
Figure 16:
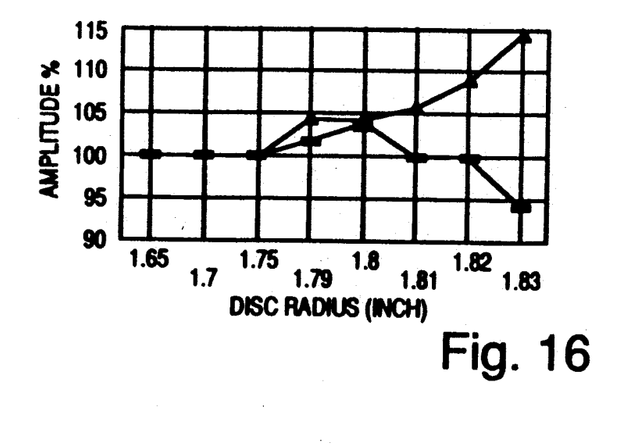
FIG. 16 is a graphical comparison of the bottom surfaces thereof.
Figure 17:
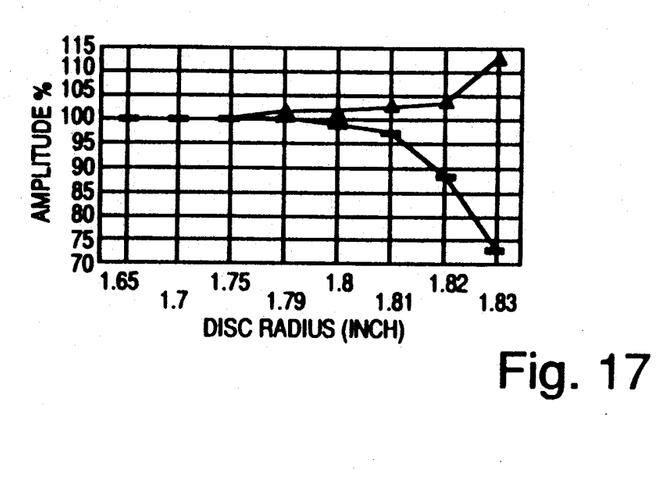
FIG. 17 is a graphical comparison of the top surfaces of a prior art disk and a finger-retained disk of the invention at half frequency.
Figure 18:
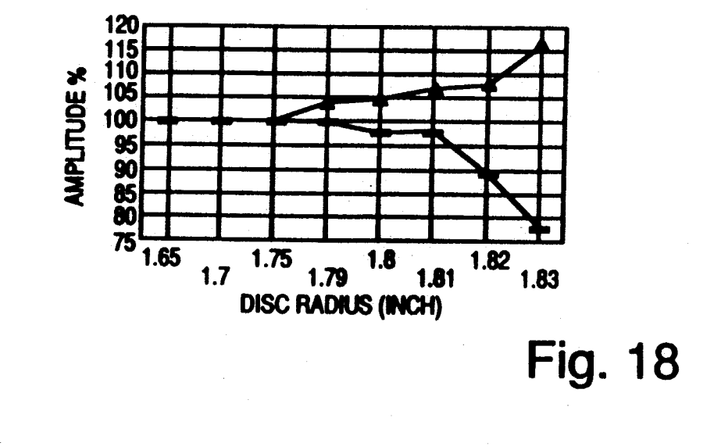
FIG. 18 is a comparison of the bottom surfaces thereof at half frequency.

FIGS. 11 and 12 are graphs of tests on the front and back respectively of a prior art disk which had been held during manufacture in a carrier of the type disclosed in U.S. Pat. No. 4,595,481. The abscissa denotes the reading at 90° positions around the disk while the ordinate denotes the coercivity of the magnetic layer in oersteds. Various plots were made at 1" (25.4 mm), 1.25" (31.8 mm), 1.50" (38.1 mm), 1.75" (44.5 mm) and 1.85" (47 mm) radial portions from the disk center. It is to be noted that in the lower plot at a radial distance of 1.85" the coercivity drops perceptibly from an average value of about 1580 Oe to a low at the 180° position of about 1520 Oe. On the back side of the disk drop-offs of an average coercivity of about 35 Oe are seen at the 270° position. These are to be compared with FIGS. 13 and 14 showing results on disks made with the apparatus and method of the present invention where essentially all coercivities are at or above 1600 Oe with the outer 1.85 radius having coercivities of about 1605 Oe on the front and about 1635 Oe on the rear side. Further, microphotos plotting signal amplitude versus disk radius show irregular signals in the prior art disks as the O.D. of the disk planar surfaces is approached unlike the usable signals in the disks manufactured by the method and carrier of the present invention.

FIGS. 15–18 show graphs of amplitude percentage plotted against disk radius from the I.D. for both prior art disks using a prior art carrier (the rectangles) and the disks manufactured by the method and apparatus of the present invention (the triangles). As can be seen the prior art disk drop off in signal amplitude (a measure of the magnetic storage capacity) starts generally at a 1.79" radius length. In the (new) disk manufactured as described hereafter, the amplitude percentage actually raises both on the disk front surface and disk back surface from about the 1.75" (44.5 mm) radius position all the way to the 1.83" (46.5 mm) O.D. of the planar annular band of the disk, to a value of up to 116% amplitude percentage, in both line frequency (FIGS. 15–16) and half line frequency (FIGS. 17–18) tests. The latter tests are considered to be "worst case" tests. From FIGS. 11, 12 and 15–18 it can be seen that the outside 0.05" (1.25 mm) or more of the planar band in the prior art disks is not usable for data storage.

Further, prior art disk carriers have been the cause of generation of contaminants which can attach to or become occluded in the magnetic media coated on the disk. This results in an area which will not properly store the data and subsequent rejection of the disk. Contamination of the disk can come about by the generation of contaminants in the handling or plugging of the disk and in any undesirable contact of the annular bands of the disk with the disk carrier during disk loading, magnetic media coating or disk unloading causing surface scratches to the parallel portions (annular bands) of the disk.

Heretofore conventional wisdom when simultaneously coating both sides of a disk held in a carrier has been to "seal" off plasma directed to one side of the disk from plasma directed to the other side of the disk. First the disk central aperture has been fully plugged and second the entire 360° of the disk periphery has been sealed by a bottom groove and a top lip so that plasma cannot pass between the disk periphery and the carrier opening. Such sealing has tended to cause contacting of surfaces on which the media is to be coated and poor coating of the outer peripheral of the disk plane surfaces.

A problem of disk "drop-out" from the carrier, i.e. the disk falling out of the carrier, due to the various disk handling and carrier handling during sputtering has also occurred. If a disk is not properly held in the carrier it can bounce out or be pushed out by the sputtering or handling forces.

In summary, a need has been perceived to meet or exceed customer disk drive specifications in the amount of disk storage at the disk periphery, allow for more accurate and reliable robot loading capability and to increase the stability of the disk in the carrier during handling and sputtering.

SUMMARY OF THE INVENTION

The present invention involves a carrier and method in which the entire parallel planar annular bands which are to receive magnetic media are entirely and properly coated with magnetic media, in which the disks are supported or retained only at the disk chamfer or at the disk transverse outer peripheral edge, in which the disk exceeds the customer magnetic specifications at the outer diameter (O.D.) of the disk, which eliminates annular band surface scratches resultant from disk contact with the carrier and which maintains essentially zero disk droppage during carrier transport and use, while maintaining effective robot loading capability. These advantages are obtained by providing a carrier and method in which a circular stump segment extends integrally and inwardly over a preferred 16° of arc at the bottom, i.e., the 180° or six o'clock position, for supporting a corresponding circular segment arc of the disk outer peripheral edge. A 16° arc was determined to be ideal for this design, however, this supporting segment can be of various widths. Segments of the disk outer peripheral edge on either side of the stump segment are thus gap-spaced from the carrier plate opening or through-bore. Disk retaining means in the form of a pair of retainers are provided at opposed symmetrical positions just below the horizontal bisector of the carrier plate opening. "Horizontal bisector" as used herein means a line drawn between the 90° and 270° positions of the carrier plate opening i.e. the three and nine o'clock positions. The disk retaining means extend symmetrically over a preferred about 16° arc so that the upper radians subtend a lower arc of about 176° which optimizes disk retention while allowing access of the disk chamfer into the retaining means.

A pair of vertical holding walls extends symmetrically over a preferred 16° arc immediately below the disk retainers on a rear portion of the carrier opening so as to keep an inserted disk in a vertical position to receive the applications of magnetic media from the plasma generated by the sputtering operation. Further, a pair of robot load walls extend symmetrically over a preferred 16° arc immediately above the disk retainers also on a rear portion of the carrier opening so as to prevent the overtilting of a disk being inserted into the carrier, which overtilting would prevent the disk outer peripheral edge from properly seating on the stump segment at the bottom of the carrier plate opening.

The result of the above carrier construction and the incorporation of bevels around the carrier bore results in the disk being essentially "floating" in the carrier bore with an actual disk-to-bore gap around about 264° (73%) of the bore. The pocket into which the disk is inserted is hence termed "a floating pocket". The remainder of the carrier bore, merely 96°, which includes the retainers, the holding walls and the robot load walls, together providing essentially four fingers forming the floating pocket, retains and supports the disk only at the disk chamfer or disk outer peripheral edge.

DETAILED DESCRIPTION

Figure 1:
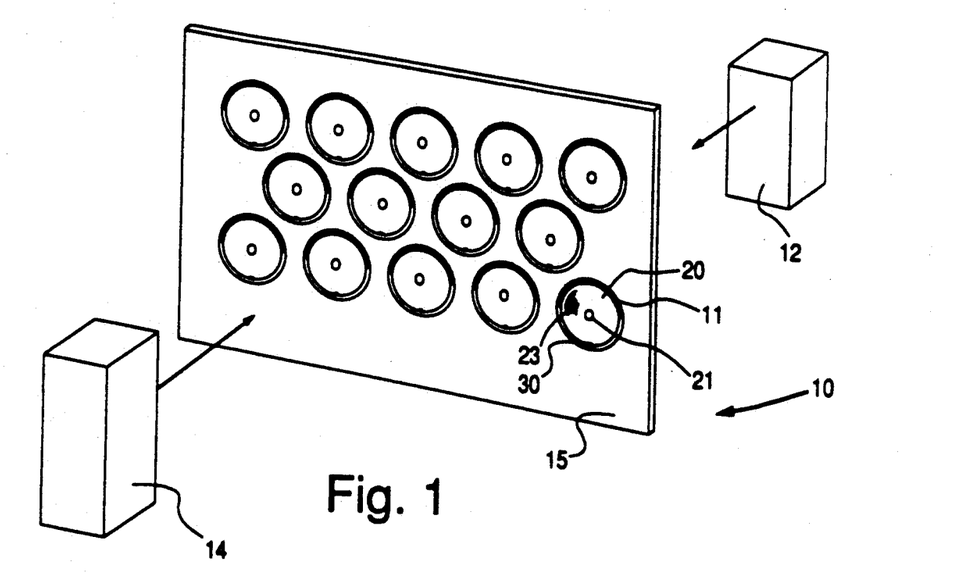
FIG. 1 is a perspective view of a disk carrier with inserted disks being coated by sputtering apparatus.

FIG. 1 illustrates a schematic view of a memory disk carrier 10 with a series of disks 20 mounted therein. The disks 20 are generally made nickel-phosphor-coated aluminum and typically have a normal nominal diameter of 13.0 cm, 9.5 cm or 6.5 cm or any other desired diameter. The disks have a central circular aperture into which a plug 21 is positioned to seal off the opposite sides of the disks and to allow robot arm pick-up and placement of the individual disks in each of aperture/bores 11 in the carrier 10, more particularly in a carrier plate 15. The carrier plate is typically made of 7075 aluminum having a thickness of from about 0.4 cm to about 1.5 cm. In a coating operation by sputtering, sputtering electrodes 12 and 14, sometimes called "targets", are placed in a well-known manner on either side of the carrier plate 15 and magnetic media, such as 20% Co, 70% Ni, and 10% Pt in the form of a plasma is coated simultaneously on the exposed essentially planar annular band 23 of all the disks on both sides of each disk. Sputtering operations can be performed utilizing a ULVAC Model SHD-14 sputtering machine manufactured by ULVAC of Chigasaki, Japan. The disks are shown as being mounted on a circular stump segment 30 integrally extending upward from the bottom of each carrier plate opening or bore 11.

Figure 2:
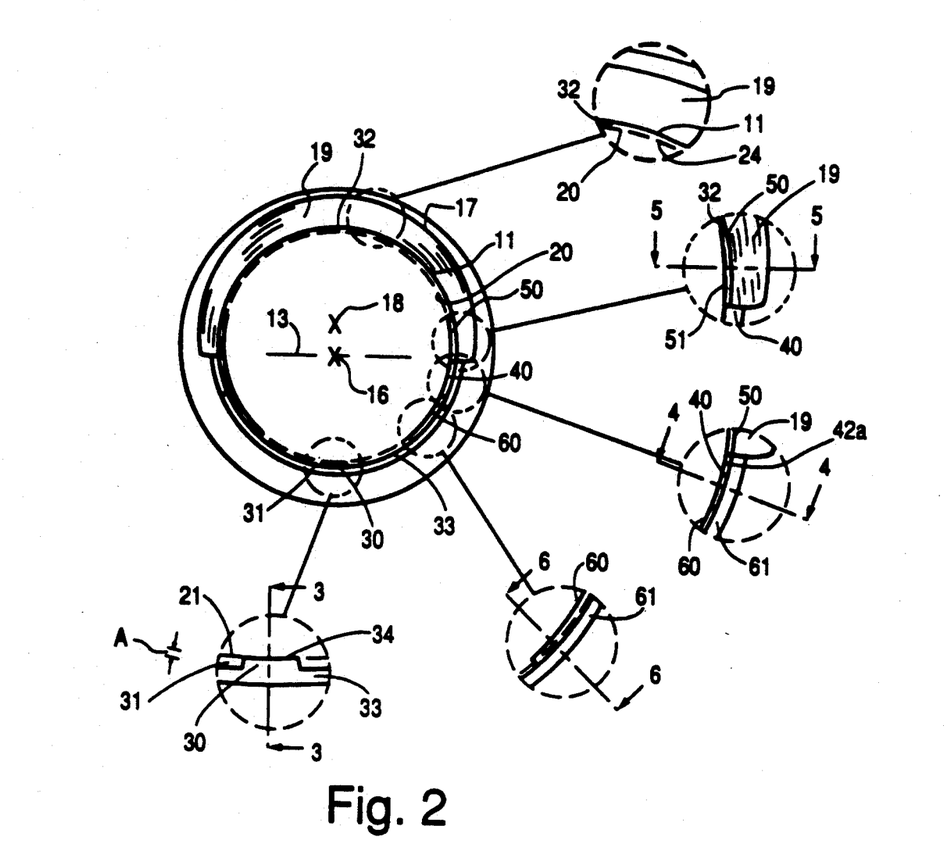
FIG. 2 is a front view of a carrier opening with enlargements of critical arc segments.
Figure 4:
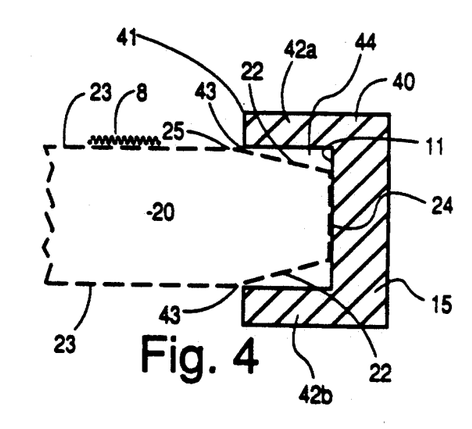
FIG. 4 is a cross-sectional view of a disk retainer segment taken on the line 4—4 of FIG. 2.

FIG. 2 is illustrative of the construction of the so-called "floating pocket" in each of the bores 11 of the carrier plate 15. The bore 11 is a generally circular-topped opening having a central axis 16. An arc recess 19 is machined or otherwise provided around the entire upper half of the bore and extending for about 2° of arc below the central horizontal bisector 13 symmetrically on both sides of the bore 11. The recess 19 is a bevelled surface 0.005" (0.13 mm) offset area having an upper edge 17 generated by a radius of curvature about an axis 18, upwardly and vertically offset from axis 16. The offset for holding a 6.5 cm disk is 4.44 mm. The disk (shown in the dotted circle) is inserted into bore 11 in a top tilted forward- orientation with the top arc of the disk within recess 19. As t he disk is moved downward the bottom half, it is guided behind a pair of oppositely disposed disk retainers 40 positioned along a preferred 16° arc of the bore commencing at about 2° of arc below the horizontal bisector 13. This arc distance may be between from about 12° to about 20° in length. Thus the upper termini or radians of the 16° arcs subtend an arc of about 176°. Each retainer is in the form of a U-shaped, box U-shaped or vee-flared with flat bottom-shaped, curved channel forming a pocket 44 having opposed pairs of legs or sides including a front lip 42a and a rear lip 42b (FIG. 4) the former extending radially inwardly from the lower ends of recess 19 on the front side of carrier plate 15. The latter lip 42b extends radially inward from the rear of the carrier plate. The lips extend radially to a position so that the lips free ends are opposite the disc chamfers 22 and spaced about 1 mm from the inserted disk, forming a gap 43 therebetween (FIG. 4). Thus, the pocket 44 formed by the lips 42a and 42b and the bore 11 is about 0.002" (0.05 mm) wider than the disk thickness (0.050 in. (1.27 mm) in a 95 mm O.D. disk) resulting in a slight play therebetween but wherein the disk planar annular bands 23 always are out of the pocket so that the pocket edges cannot scratch those disk surfaces to be or being coated with magnetic media.

The chamfered edges 22 (FIG. 4) extend from the disk cylindrical outer peripheral edge 24 to the planar annular bands 23 of the disk. This permits exposure of the entire annular band 23 of the planar surfaces on both the disk sides, to the coating plasma. This results in magnetic media 8 being coated in a desired operable area right out to the outer peripheral edges 25 of the annular bands 23. Typically in a 95 mm disk the chamfer extends at a 26° angle from the disk peripheral edge 25 along a taper distance of 0.25 mm.

Figure 6:
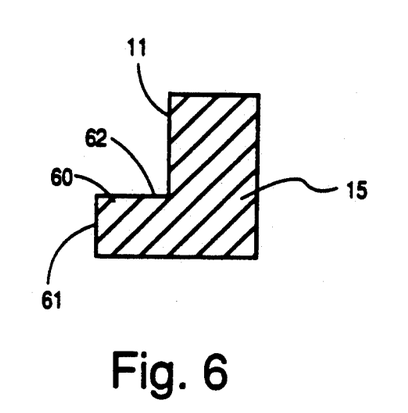
FIG. 6 is a cross-sectional view of a vertical holding wall segment taken on the line 6—6 of FIG. 2.

FIG. 2 also shows the location of a pair of arc segment vertical holding walls 60 (also seen in FIG. 6) which extend integrally and downward from the back side lips 42b of the retainers 40. The disk 20 is lowered into the retainers 60 until the bottom edge of the disk abuts the stump segment 30 at the bottom of bore 11. The top of the stump segment is curved to follow the disk O.D. In this position the disk chamfer abuts the rear vertical holding wall and supports the chamfered disk in a vertical position viz a viz the stump segment and the carrier plate. This rear vertical holding wall is an integral continuation of the back lip 42b as more clearly seen in the perspective view of FIG. 9. The holding walls may extend from about 12° to 20° of arc with a preferred arc of 16°.

Figure 5:
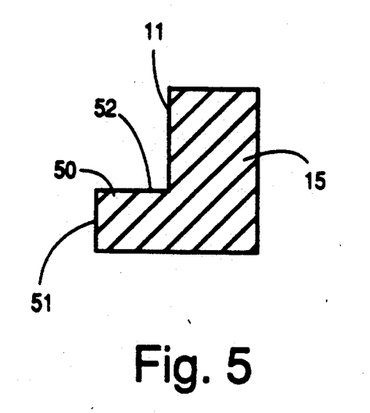
FIG. 5 is a cross-sectional view of robot load wall segment taken on the line 5—5 of FIG. 2.

In addition, an upper extension of lip 42b is provided to form a robot load wall or stop 50 (also seen in FIGS. 5 and 9) which restricts any over-tilting of a disk when the disk is being inserted into and lowered in the carrier plate opening or bore 11. If the top half of the disk were to tilt rearwardly too much, the bottom edge of the disk would miss its intended abutment with stump segment 30 by clearing the front of the stump segment when the disk is lowered. As with the lip 42b and edge 61 of the vertical holding wall 60, the inside edge 51 of the load wall 50 extends radially inward to a position outward of the inserted disk annular band peripheral edge 25, i.e. it extends radially inward to terminate alongside disk chamfer 22 on the rear side of disk.

Once the disk has seated on the bore stump segment 30 the weight (load) of the disk is distributed over the entire top curved surface of the stump segment. Since there is no line-contact it is highly unlikely that the disk, retained in the rear by holding wall 50, lip 42b and load wall 60 and retained on the front by lip 42a, would jump or be jiggled out of the carrier plate by forces attendant to disk loading, plasma coating or disk unloading. Further, denting of the disk outer peripheral edge due to any "bouncing" of the disk is essentially prevented.

Figure 3:
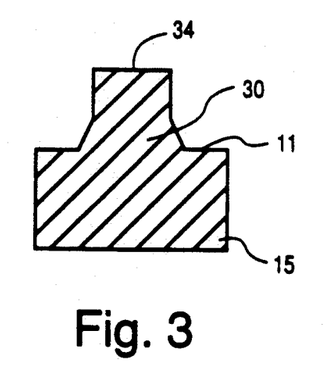
FIG. 3 is a cross-section view of a disk stump segment taken on the line 3—3 of FIG. 2.

FIG. 3 and the enlargement of stump segment 30 shows the disk-matching curvature 34 at the top of the segment. The height A of the stump segment for holding a 6.5 cm disk is about 1.2 mm. The stump segment may extend over about 6° to about 40° of arc but preferably extends over a 16° arc. The stump segment forms annular gap segments 31,33 extending from the outer edges of the stump segment to the lower edge of the vertical holding walls 60. Once the inserted disk 20 seats on the stump segment 30 in a vertical position the top part of disk edge 21 is gapped about the upper 152° arc of the bore 11 particularly as shown by gap 32 in the top enlargement in FIG. 2. The gaps 31,32 and 33 add up to about 248° of gap length which permits easy access of the plasma onto the annular bands being coated.

It has been found that these gaps of about 1.2 mm width do not result in any undesirable cross-contamination of one side of the disk from plasma being coated on the other side of the disk. It is believed that this is true because of the smallness of the gap, which preferably is in the range of about 0.015" (0.4 mm) to about 0.125" (3 mm). Further, each bore 11 of the carrier plate has a bevel 13a and the stump segment has side bevels 35 which also allow the magnetic media plasma to have access to and more easily effectively coat the disk annular bands right out to their peripheral edges 25.

Figure 7:
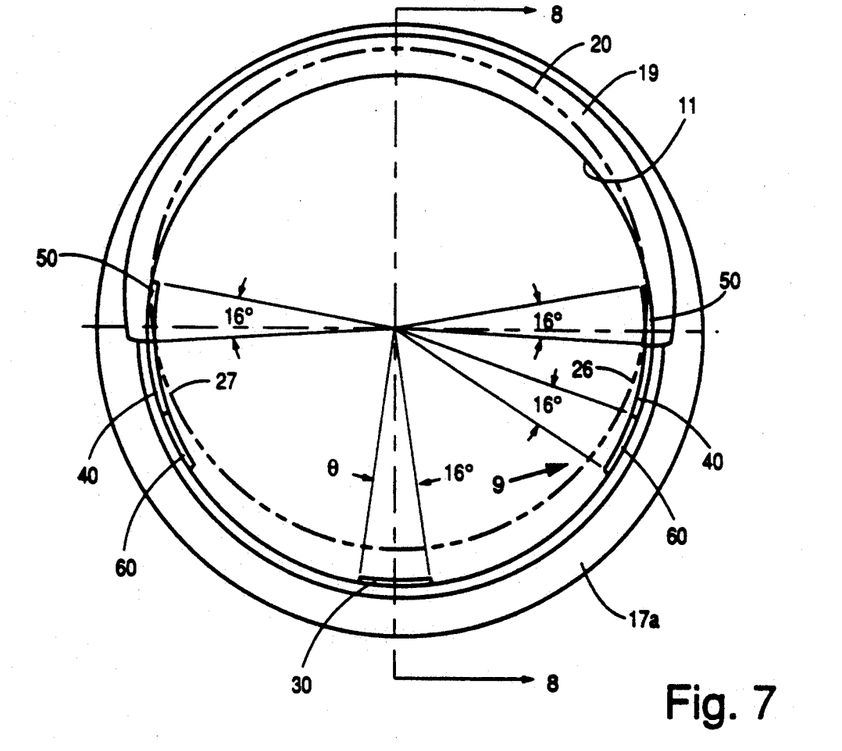
FIG. 7 is an enlarged front view of the carrier opening illustrating robotic placement of a disk therein.
Figure 8:
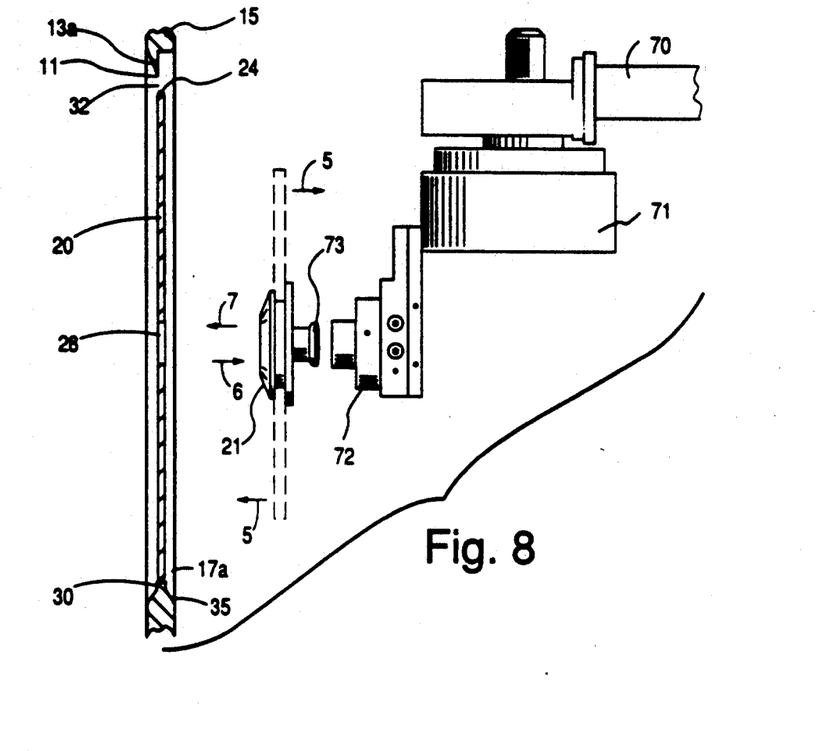
FIG. 8 is a cross-sectional view taken on the line 8—8 of FIG. 7 also showing (by an enlarged schematic) disk plugging and robotic loading and unloading of the disk.
Figures 9, 10:
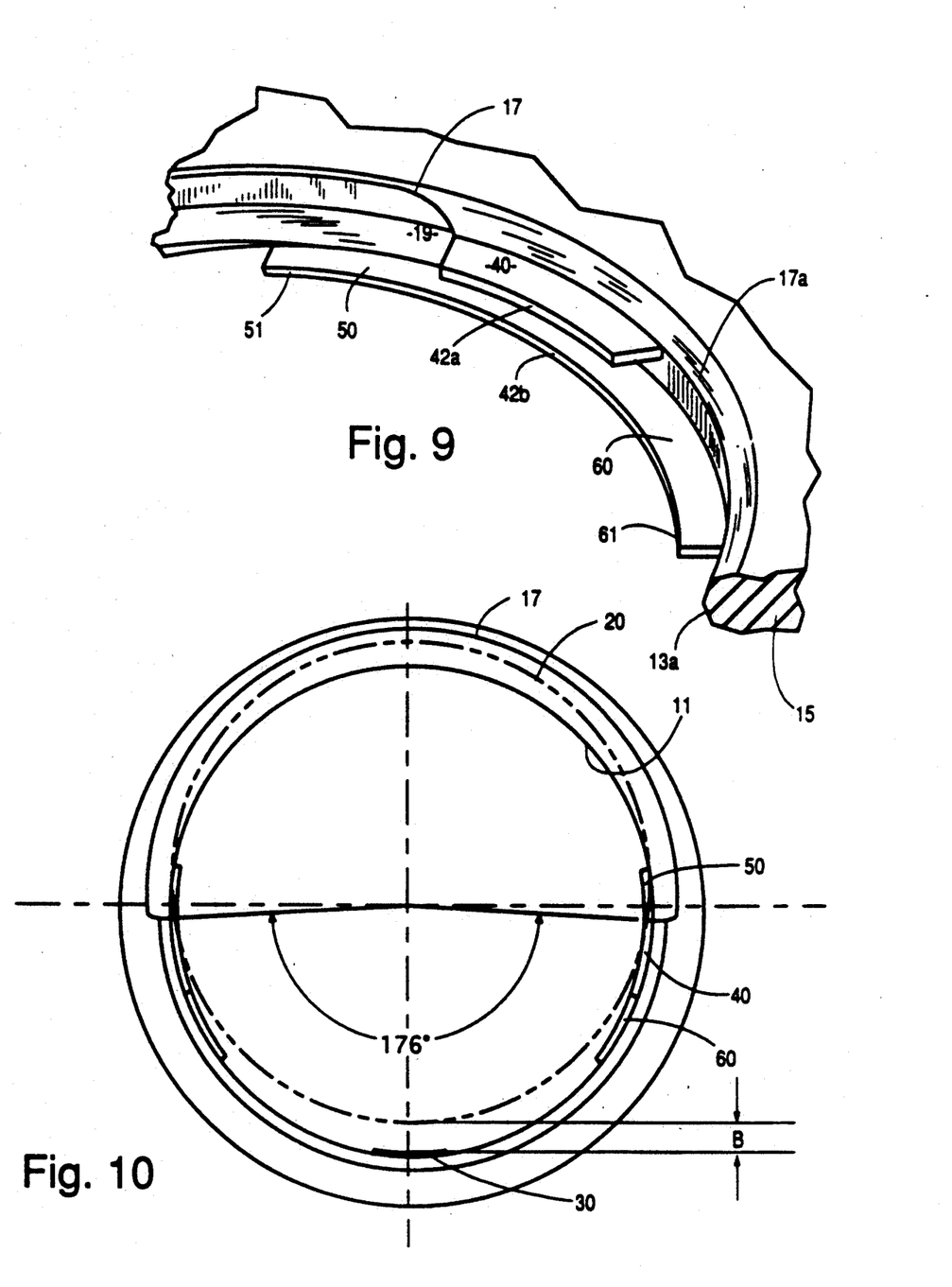
FIG. 9 is a perspective view of a segment of the carrier bore showing a retainer, a vertical hold wall and robot load wall as viewed along arrow 9 in FIG. 7.
FIG. 10 is a front view illustrating the included angle at the location of the retainers and the insertion height of the disk.

FIG. 7 illustrates the position of disk 20 (dashed circle) immediately prior to it being downwardly inserted into retainers 40 with disk portions 26, 27 having already passed clear of the retainers. A subsequent downward movement B of about 3.81 mm, as seen in FIG. 10, seats the disk chamber 22 in the retainers and the disk bottom edge segment on the stump segment 30. Distance B is about 0.63 mm greater than in prior art vertical insertion distances for the same size of disk. This gives added vertical lift and is beneficial since the added lift requires that a disk be inadvertently bounced a greater height in order for the disk to bounce out of the pocket 44 and the carrier plate. Angle $\theta$, the arc length of the stump segment, is preferably about 16°, as is each of the retainers, the vertical holding walls and the robot load walls. FIG. 8 shows the disk sitting on stump segment 30 in installed position and the top gap 32 between the top peripheral edge 24 of the disk and bore 11. It also clearly shows rear-side bevel 13 in side view and bevel 17a, which allows plasma to easily access all of the disk annular band surface. Since the top of the stump segment thickness is essentially the same as the thickness of the inserted disk, i.e. 0.050" (1.27 mm) in a 3.5" (95 mm) O.D. disk, and contiguous portions of the carrier plate opening at the gap segments do not interfere with the plasma impinging the disk annular band surfaces 23, the plasma being directed to the disk periphery "sees" no changes in the surface to be coated, i.e. it coats adjacent portions of the carrier as if those portions were extensions of the disk periphery. This insures that the plasma is not disturbed and that the magnetic media is coated homogeneously.

The method of the present invention is practiced by providing chamfered edges on the disk between the outer circumference of the annular band surfaces and the outer peripheral edge; providing a vertically-oriented disk carrier having a circular opening therein, the opening including a bottom disk-supporting stump segment extending radially inward of the carrier plate opening and a disk retaining channel extending from opposite sides of the carrier plate opening at a position below a horizontal bisector of the carrier plate opening and radially outward of the annular band surfaces; plugging the disk central aperture; orienting the disk to vertically face the carrier; inserting (arrow 7—FIG. 8) and tilting (arrow 6) the disk laterally into the carrier opening and into the disk retaining channel such that the disk peripheral edge and the chamfered edges seat in the disk retaining channel; lowering the disk such that the annular band do not touch the carrier and such that the disk outer peripheral edge abuts on the stump segment, such that more than half of the circumference of the disk is gap-spaced from the carrier opening thus exposing all of the disk annular bands in the carrier opening; coating all of the annular bands of the disk simultaneous with a magnetic media; and removing (arrow 5) the coated disk from the disk retaining channel and off the stump segment without the magnetic media-coated annular bands touching the carrier. The method also entails the step of preventing an over tilting of the disk relative to the carrier, such that the disk peripheral edge does not miss abutting the stump segment during the lowering step. In the plugging step, a plug of the type shown in the related application or in U.S. Pat. Nos. 4,634,512 or 4,735,701 is employed in plugging the disk aperture, said plug being holdable and movable with the disk by a robot arm to perform the disk orienting, inserting, lowering and removing steps set forth. These steps may be performed by a technician manually operating and utilizing a force/torque transducer 71 such as Model No. UFS-4012 A-15 from JR3 Co. of Woodland, Calif. mounted at the end of a robot arm 70 part of a Seiko robot (TD4000 SC or TD 3000). A vacuum end-effector or plug-gripper 72 is mounted on an opposite side of the transducer for grasping a knob 73 of a disk control plug 21, as is shown in the related application or in U.S. Pat. Nos. 4,634,512 or 4,735,701. Manipulation of the disk including tilting, insertion and removal (arrow 5, 6 and 7), can be done in six axes movements. The plug gripper may be of the jaw-type. The coating step comprises sputtering a magnetic media plasma on said annular bands. The method also envisions, after the lowering step, orienting the disk vertically with respect to the carrier to support the disk vertically in the carrier.

The above description of the preferred embodiment of this invention is intended to be illustrative and not limiting. Other embodiments of this invention will be obvious to those skilled in the art in view of the above disclosure.

We claim:

1. In combination, a circular memory disk and vertically-oriented carrier plate for holding the circular memory disk during coating of the disk with magnetic media, wherein the disk includes a central aperture, a transverse cylindrical outer peripheral edge, a planar cylindrical annular band for receiving magnetic media and extending on both sides of the disk from the central aperture to a position adjacent to the outer peripheral edge and a chamfered edge connecting the outer periphery of the annular bands and the disk cylindrical outer peripheral edge; and wherein the carrier plate includes an essentially circular opening having a diameter greater than the diameter of the disk, a cylindrical-topped stump segment positioned along a bottom arc of the carrier plate opening and extending radially inwardly of the opening forming a cylindrical surface for receiving an abutting corresponding cylindrical segment arc of the disk cylindrical outer peripheral edge such that adjacent segments of the disk cylindrical outer peripheral edge are gap-spaced from the carrier plate opening; and disk retaining means extending along a pair of symmetrical arc segments of the carrier plate opening commencing immediately below a horizontal bisector of the carrier plate opening and extending to a position spaced from said stump segment for retaining the disk in the carrier plate opening when the disk is mounted in the carrier plate opening, and wherein said disk retaining means includes radial inner ends positioned radially outward of the disk annular bands.

2. The combination of claim 1 wherein the disk retaining means includes wall means for forming a pocket overlapping a segment of only the chamfered edge of the disk such that the wall means does not extend radially into the disk annular bands.

3. The combination of claim 2 wherein the pocket comprises a radial inwardly-facing channel having the radial inner ends of each leg of the channel forming the disk retaining means terminating adjacent to the chamfered edge of the disk.

4. The combination of claim 3 further comprising a first wall arc segment extending from one of the legs of the channel in a direction toward the stump segment for holding the disk in a vertical abutting position on the stump segment.

5. The combination of claim 4 further comprising a second wall arc segment extending from said one of the legs of the channel in a direction away from the stump segment for preventing a disk being mounted into the carrier plate opening from overly tilting so as to cause non-abutment of the disk cylindrical segment arc on the stump segment.

6. The combination of claim 1 wherein the stump segment extends integrally from an edge of the carrier plate opening over an arc of from about 12° to about 20°.

7. The combination of claim 6 wherein said stump segment extends over an arc of about 16°.

8. The combination of claim 7 in which the stump segment extends about 50 mils from the carrier plate opening to give an about 50 mil gap between the disk peripheral edge adjacent segments and the carrier plate opening.

9. The combination of claim 6 in which the stump segment extends radially inwardly from about 0.3 mm to about 3 mm from the carrier plate opening.

10. The combination of claim 1 in which the disk retaining means extends integrally from an edge of the carrier plate opening on each of opposed lateral sides of the carrier plate opening over a circular arc on each lateral side of from about 6° to 40° and has upper termini extending from about 1° to 5° below the horizontal bisector of the carrier plate opening.

11. The combination of claim 10 wherein the disk retaining means extending along the pair of symmetrical arc segments extends over an about 16° arc and the upper termini of about 16° arcs are about 2° below the horizontal bisector of the carrier plate opening such that the upper termini subtend an arc of about 176°.

12. The combination of claim 1 wherein the disk retaining means comprises a U-shaped curved channel pocket overlapping the chamfered edge of a disk mounted in the carrier plate opening, the channel pocket having a bottom for abutment of a corresponding arc segment of the disk outer peripheral edge and pocket sides spaced from a mounted disk and having a radial length less than the radial length component of the chamfered edge parallel to the disk annular bands, such that the disk retainer means cannot impact the disk annular bands.

13. The combination of claim 1 further comprising means extending from a rear side of said carrier plate opening opposite the side from which the disk is mounted in the carrier plate opening for vertically holding the disk in the carrier plate opening.

14. The combination of claim 13 in which the means for vertically holding comprises a rear side lip continuation of the disk retaining means extending toward the stump segment.

15. The combination of claim 1 further comprising means extending from the carrier plate opening above the horizontal bisector of the carrier plate opening for preventing a disk being mounted into the carrier plate opening from overly tilting so as to cause non-abutment of the disk segment arc on the stump segment.

16. The combination of claim 15 in which the means for preventing the overly tilting comprises a rear side lip continuation of the disk retaining means extending to above the horizontal bisector of the carrier plate opening.

17. The combination of claim 15 in which the means for preventing the overly tilting extends about 16° above the horizontal bisector of the carrier plate opening such that the outer peripheral edge of a mounted disk has a gap source from the carrier plate opening over about a top arc of about 140°.

18. The combination of claim 17 in which the gap space is about 50 mils such that the total surface of the disk annular bands is coated by magnetic media.

19. The method of manufacturing a data storage disk having planar cylindrical annular band surfaces for receiving magnetic media on opposite sides of the disk and a central aperture comprising:

providing chamfered edges on the disk between the outer circumference of the annular band surfaces and the outer peripheral edge;

providing a vertically-oriented disk carrier having a circular opening therein, the opening including a bottom disk-supporting stump segment extending radially inward of the carrier plate opening and a disk retaining channel extending from opposite sides of the carrier plate opening at a position below a horizontal bisection of the carrier plate opening and radially outward of the annular band surfaces;

plugging the disk central aperture;

orienting the disk to vertically face the carrier;

inserting and tilting the disk laterally into the carrier opening and into the disk retaining channel such that the disk peripheral edge and the chamfered edges seat in the disk retaining channel;

lowering the disk such that the annular band surfaces do not touch the carrier and such that the disk outer peripheral edge abuts on the stump segment, such that more than half of the circumference of the disk is gap-spaced from the carrier opening thus exposing all of said disk annular band surfaces in said carrier opening;

coating all of the annular band surfaces of the disk simultaneous with a magnetic media; and removing the coated disk from the disk retaining channel and off the stump segment without the magnetic media-coated annular band surfaces touching the carrier.

20. The method of claim 19 further comprising preventing an over tilting of the disk relative to the carrier, such that the disk peripheral edge does not miss abutting the stump segment during the lowering step.

21. The method of claim 20 wherein a plug is employed in plugging the disk aperture, said plug being holdable and movable with the disk by a robot arm to perform the disk orienting, inserting, lowering and removing steps set forth.

22. The method of claim 19 wherein the coating step comprises sputtering a magnetic media plasma on said annular band surfaces.

23. The method of claim 19 further comprising, after the lowering step, orienting the disk vertically with respect to the carrier to support the disk vertically in the carrier.

24. In combination, a circular memory disk and vertically-oriented carrier plate for holding the circular memory disk during coating of the disk with magnetic media, wherein the disk includes a central aperture, a transverse cylindrical outer peripheral edge, a planar cylindrical annular band for receiving magnetic media and extending on both sides of the disk from the central aperture to a position adjacent to the outer peripheral edge and a chamfered edge connecting the outer periphery of the annular bands and the disk cylindrical outer peripheral edge; and wherein the carrier plate includes an essentially circular opening having a diameter greater than the diameter of the disk, a fixed arcuate stump segment extending radially inwardly from a bottom arc of said carrier plate opening for receiving a bottom arc of the disk cylindrical outer peripheral edge, and a pair of spaced retaining lips extending radially inwardly at an arc of the carrier plate from adjacent the horizontal bisector of said carrier plate opening to a position spaced from each end of said stump segment, such that each pair of retaining lips form a floating pocket for the disk and with said stump segment, retains and supports the disk in said carrier plate opening at the disk chamfer or the disk cylindrical outer peripheral edge, and wherein a gap is provided between the disk cylindrical outer peripheral edge and the carrier plate opening extending over more than half of the circumference of said carrier plate opening.

25. The combination of claim 24 in which said gap is provided over about 264° of the circumference of said carrier plate opening.

26. The combination of claim 24 further including a carrier rear holding wall and a carrier rear load wall each integrally extending from a rearward one of said retaining lips, said carrier rear holding wall extending downward from said rearward lip over from 12° to 20° of arc toward said stump segment and said rear load wall extending upward from said rear lip over from 12° to 20° of arc.

* * * * *